(12) United States Patent
Mattila et al.

(10) Patent No.: US 7,248,128 B2
(45) Date of Patent: Jul. 24, 2007

(54) REFERENCE OSCILLATOR FREQUENCY STABILIZATION

(75) Inventors: Tomi Mattila, Espoo (FI); Aarne Oja, Espoo (FI); Olli Jaakkola, Helsinki (FI); Heikki Seppä, Helsinki (FI)

(73) Assignee: Nokia Corporation, Espoo (FI)

( * ) Notice: Subject to any disclaimer, the term of this patent is extended or adjusted under 35 U.S.C. 154(b) by 12 days.

(21) Appl. No.: 11/050,142

(22) Filed: Feb. 2, 2005

(65) Prior Publication Data

US 2005/0184822 A1   Aug. 25, 2005

(30) Foreign Application Priority Data

Feb. 3, 2004   (FI)   ................... 20040162

(51) Int. Cl.
*H03L 7/00*   (2006.01)

(52) U.S. Cl. ............ 331/175; 331/49; 331/107 P; 331/116 M; 331/116 R; 331/141; 331/154

(58) Field of Classification Search .......... 331/49, 331/107 P, 116 M, 116 R, 141, 154, 175
See application file for complete search history.

(56) References Cited

U.S. PATENT DOCUMENTS

| | | | | |
|---|---|---|---|---|
| 4,984,241 A | 1/1991 | Truong | ............ | 371/36 |
| 5,406,231 A | 4/1995 | Jylha | ............ | 331/49 |
| 5,640,133 A | 6/1997 | MacDonald et al. | ........ | 333/197 |
| 5,719,073 A | 2/1998 | Shaw et al. | .......... | 437/228 |
| 6,049,702 A * | 4/2000 | Tham et al. | ........ | 455/78 |
| 6,094,102 A | 7/2000 | Chang et al. | ......... | 331/17 |
| 6,600,252 B2 * | 7/2003 | Nguyen | .......... | 310/309 |
| 6,995,622 B2 * | 2/2006 | Partridge et al. | ........ | 331/66 |
| 2002/0069701 A1 | 6/2002 | Hsu et al. | ............ | 73/497 |
| 2003/0051550 A1 | 3/2003 | Nguyen et al. | ......... | 73/514.36 |
| 2003/0210101 A1 | 11/2003 | McCorquodale et al. | ... | 331/117 |
| 2004/0113722 A1 | 6/2004 | Bircumshaw et al. | ....... | 333/197 |

FOREIGN PATENT DOCUMENTS

| | | |
|---|---|---|
| EP | 0 962 999 A2 | 12/1999 |
| EP | 0 962 999 A3 | 5/2001 |
| WO | WO 01/82467 A2 | 11/2001 |
| WO | WO 01/82467 A3 | 11/2001 |
| WO | WO 02/35699 A1 | 5/2002 |

OTHER PUBLICATIONS

De Los Santos, H.J., "RF MEMS Circuit Design for Wireless Communication", 2002, Artech House, Boston/London, pp. 180-191.

* cited by examiner

*Primary Examiner*—Robert Pascal
*Assistant Examiner*—Levi Gannon
(74) *Attorney, Agent, or Firm*—Harrington & Smith, PC

(57) ABSTRACT

Method for stabilizing the frequency of a MEMS (Micro Electro Mechanical Systems) reference oscillator, and a MEMS reference oscillator, wherein the method comprises following steps: using two or more MEMS components, wherein each MEMS component is characterized by a set of properties, and selectively combining the desired properties from the MEMS components.

7 Claims, 9 Drawing Sheets

REFERENCE OSCILLATOR FREQUENCY STABILIZATION

FIELD OF INVENTION

The present invention relates to a method for stabilizing the frequency of a reference oscillator. More specifically, the present invention relates to a method for stabilizing the frequency of a MEMS (Micro Electro Mechanical Systems) reference oscillator. The present invention also relates to a reference oscillator, especially a MEMS reference oscillator.

BACKGROUND OF THE INVENTION

Reference oscillators are used as precise and stable frequency references in innumerable applications. They are used for obtaining a precise frequency reference and/or for obtaining a precise time reference. Such reference oscillators are needed, e.g., in devices which communicate using radiofrequency links, or otherwise use precisely defined frequencies. Reference oscillators are also needed in precise clocks and timing circuits.

The critical requirements for a reference oscillator are (1) high long-term stability (low drift/ageing), (2) low phase noise, (3) high thermal stability, e.g., low thermal coefficient, and (4) precise value for the reference oscillator frequency. In most high-volume applications, the following features are also important: (5) small size, (6) low power consumption, (7) high integration level between the resonator, the oscillator electronics, and the device package, and (8) low cost.

Quartz crystals are typically used for resonators in high-quality reference oscillators. Disadvantages of these crystals are their large size and incompatibility for monolithic integration with electronics.

Modern micromachining makes it possible to fabricate miniaturized mechanical resonators (Micro Electro Mechanical Systems=MEMS) with resonance frequencies ranging from several kHz up to GHz range. Examples of such microresonators based on surface or bulk micromachining of silicon are presented in H. J. De Los Santos, "RF MEMS Circuit Design for Wireless Communications", Artech House, Boston/London, 2002. The advantages of microresonators include small size, low power consumption, and possibility for increased integration level between the resonator, the oscillator electronics, and the device package. Both monolithic integration and the system-on-chip approach are viable solutions for increasing the integration level of a reference oscillator. Monolithic integration of micromachined resonators and integrated circuits will facilitate also more complicated micro-electro-mechanical circuits.

There exist, however, several complications related to realizing a MEMS-based reference oscillator. (i) A reference-quality long-term stability is challenging to achieve using microsize resonators, in particular when a good phase noise performance is to be obtained from the same device. (ii) The thermal coefficient for the resonance frequency of the microresonators is typically in the range [−10, −40] ppm/K and are thus far too large for typical reference oscillator applications. (Proposed solutions to temperature dependence compensation include adjusting the bias voltage, see for example U.S. Pat. No. 5,640,133, MacDonald et al, adjusting the width of the capacitive coupling gap, see for example U.S. Patent Application 20030051550, Nguyen and Hsu, or utilizing mechanical stress, see for example U.S. Patent Application 20020069701, Hsu and Nguyen.) (iii) The small dimensions in microsize resonators make considerable challenges to fabrication tolerances to obtain precise resonator frequencies. In summary, demonstrating a MEMS reference oscillator having simultaneously all the desired properties (1)-(4), has turned out to be difficult.

THE PRESENT INVENTION

It is therefore an object of the present invention to eliminate the disadvantages of the prior art and to provide a MEMS reference oscillator having improved properties (1)-(4).

It is further an object of the present invention to provide a method to stabilize the frequency of an oscillator based on MEMS components using techniques that can be adopted to fabrication of highly integrated, low-phase-noise reference oscillators.

The present Invention provides a solution to the disadvantages of the prior art by a selective combination of the desired properties from two or more MEMS components.

Each MEMS oscillator component is characterized by a set of properties, typically distinct from each other. A combiner or alike synthesizes the desired output by a selective combination of the properties in the components. To accomplish this, the combiner can use several techniques, for example processing of the oscillators' signals, feedback adjustment of the two oscillators and utilizing additional inputs such as the measured temperature of the oscillators.

Characteristic features of the present invention are in detail presented in the enclosed claims.

The use of two or more MEMS components is technologically feasible and rational solution since micromachining and IC-processes are intrinsically scalable to the fabrication of several components in parallel and combination of their operation.

BRIEF DESCRIPTION OF DRAWINGS

The foregoing, and additional objects, features and advantages of the present invention will be more clearly understood from the following detailed description of preferred embodiments of the present invention, taken in conjunction with accompanying drawings, in which.

DETAILED DESCRIPTION OF THE INVENTION

Figure 1:
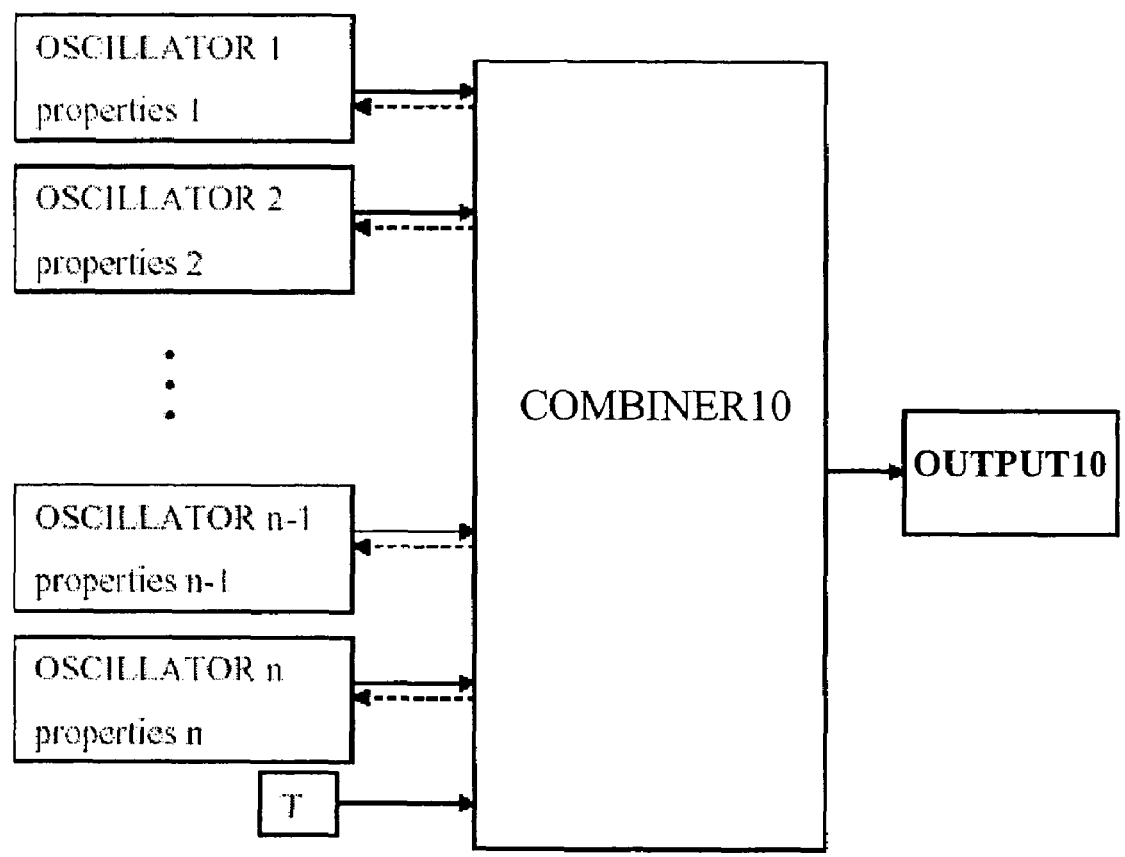
FIG. 1 is a schematic description of the invented reference oscillator which consists of two or more micromachined oscillators and the selective combination of their properties.

The Invention is illustrated schematically in FIG. 1 using the combination of Oscillators as an example (an Oscillator denotes here a generalized frequency selective micromachined component). Each micromachined Oscillator i (i=1, 2, . . . , n−1, n) is characterized by a set of Properties i (i=1, 2, . . . , n−1, n), typically distinct from each other. The Combiner COMBINER10 synthesizes the desired output OUTPUT10 by a selective combination of the Properties i the n Components. To accomplish this, the Combiner can use several techniques described below in Methods 1 and 2.

Method 1

Figure 2:
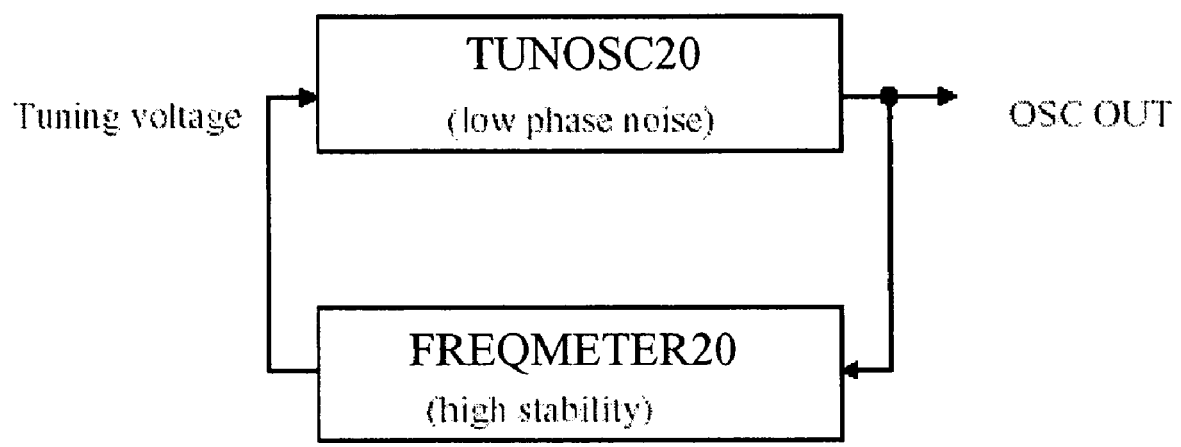
FIG. 2 is a block diagram of the reference oscillator which consists of a tunable, low-phase noise oscillator and a frequency meter which stabilizes the oscillator frequency by using the feedback connection.

In Method 1, illustrated in FIG. 2, a tunable oscillator TUNOSC20 based on a micromachined resonator creates the low phase noise output signal. The long-term stability for the oscillator is provided by a frequency meter FREQMETER20 that monitors the frequency of the oscillator and adjusts frequency to the desired reference value. The frequency meter is as well based on micromachined component as described in detail below. As the tunable oscillator does not have to provide the long-term stability for itself, it can utilize designs that more easily allow (i) sufficient tunability for temperature and fabrication error compensation and (ii) good short-term stability (phase noise). On the other hand, as the frequency meter does not have to provide tunability or good phase noise, designs aiming only at high long-term stability can be used.

Operation of the component providing the long-term stability is based on stable electrical or electromechanical properties. In Realization A (FIG. 3) the stable frequency reference is based on an bulk acoustic mode oscillator. The frequency meter operation is in this case based on comparing the frequency created by the bulk acoustic wave oscillator with the output frequency of the tunable oscillator TUNOSC30. In Realization B (FIG. 4) the stable frequency reference is obtained by measuring the phase difference of propagating bulk acoustical wave in a micromachined sound-wave guide at fixed positions (delay-line technique). In Realization C (FIG. 5) the frequency meter is based on stable capacitors $C_A$, $C_B$ and stable micromachined thin-film resistors $R_A$, $R_B$ that are used to create the Wien oscillator topology. The capacitor-resistor network, that is part of the Wien oscillator circuit, can also be used as a frequency meter in which the capacitors and resistors form a bridge circuit the balance of which depends on the frequency of the incoming frequency.

Figure 6:
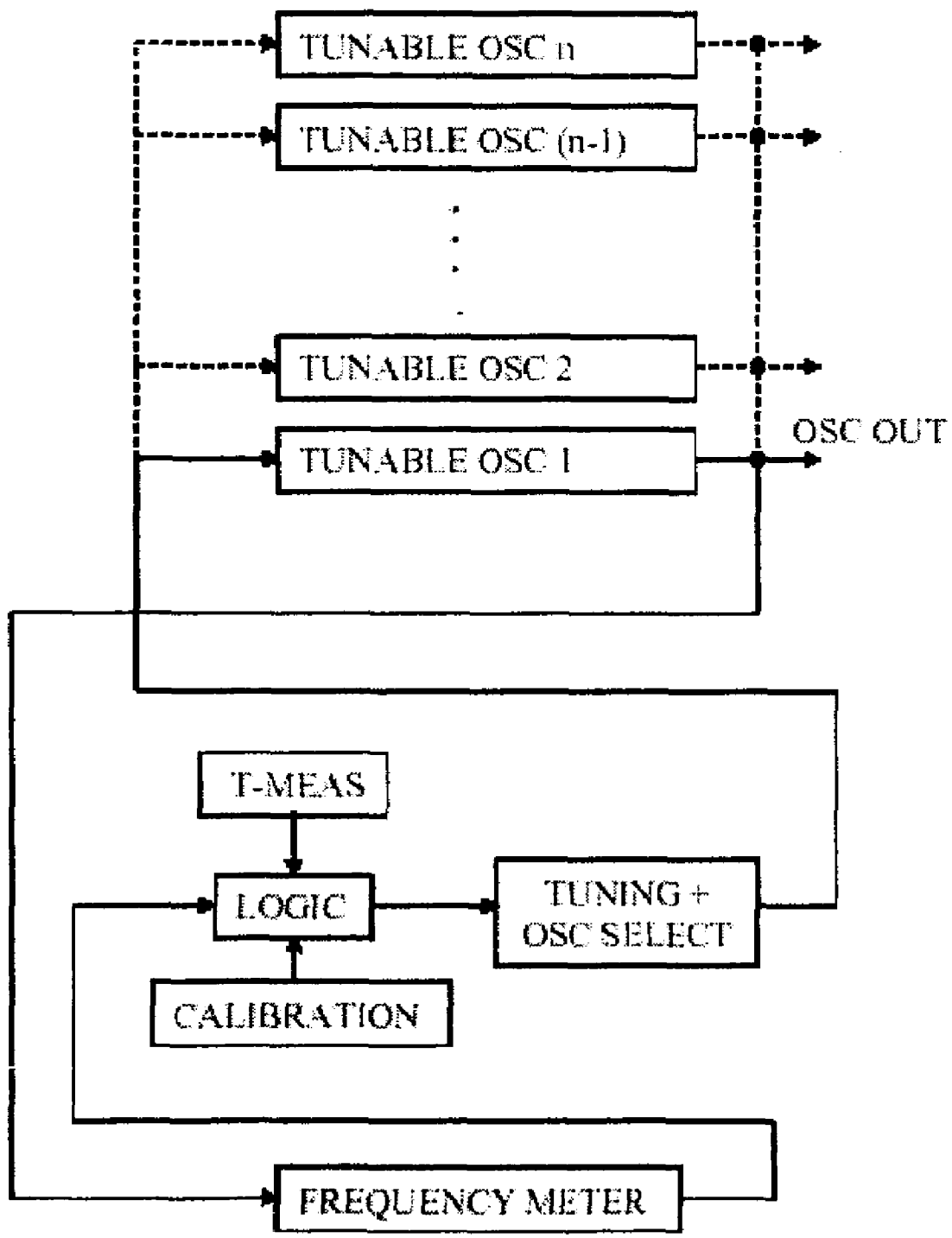
FIG. 6 illustrates how temperature compensation in the scheme of FIG. 1 can be realized using a set of resonators with slightly different resonance frequencies in the case a single oscillator cannot be tuned enough.

The good phase noise requirement for the tunable oscillator can be realized using several micromachined resonator types, in particular the relaxed long-term stability requirement allows the use of flexural mode resonators in addition to bulk acoustic wave resonators. In case it becomes difficult to obtain a sufficient tunability range for temperature compensation using a single resonator, one can utilize a bank of two or more oscillators based on resonators that have slightly different resonance frequencies to reduce the tunability range as shown in FIG. 6.

FIG. 2. is a block diagram of a reference oscillator which consists of a tunable oscillator TUNOSC20 and a frequency meter FREQMETER20 which stabilizes (long-term) the oscillator frequency by using the feedback connection.

Three realizations of the frequency meter will be described:

In Realization A (FIG. 3) the high-stability (long-term) frequency meter is created via an oscillator based on micromachined silicon resonator operated in bulk acoustic mode (denoted by "BAWOSC30").

The frequency of the tunable osc TUNOSC30 is compared with the BAW OSC frequency, e.g., using a mixer followed by a low-pass filter (LPF30) and a frequency counter COUNTER30 and the detected frequency difference is processed ("LOGIC30") to create a tuning voltage for adjusting the tunable osc TUNOSC30 to the correct frequency. It is important to note that the counted frequency difference remains not constant but depends on the temperature since BAWOSC30 frequency is a function of the temperature. However, since the BAWOSC frequency is an accurately known and stable function of the temperature, it can be used as a frequency reference by measuring the temperature ("T-MEAS30"). The temperature-induced reference offset is then taken into account in the circuitry creating the tuning voltage.

In Realization B (FIG. 4) the frequency meter is based on a measurement of the phase of an acoustical signal propagating in a micromachined acoustical delay line DELAYLINE40. The oscillator signal to be measured is used to generate a sound wave at one end of an acoustical delay line. An exponential horn-like electrode at the end of the delay line lowers the acoustical impedance of the line. The other end of the line has been designed to terminate the acoustical signal at a matched dissipative load so that there will be no reflections (no standing waves). The phase of the unidirectional acoustical signal is probed at two points along the delay line, denoted by A and B in FIG. 4. The acoustical signal propagating in the line is detected by measuring the motion of the delay line surface using two micromachined DC-biased electrodes, denoted by $C_A$ and $C_B$. It is convenient, for example, to adjust the length of the delay line between points A and B ($L_{AB}$) so that $L_{AB}=c/(4f_0)$, where c is the sound velocity in the micromachined silicon delay line, and $f_0$ is the nominal value of the frequency of the reference oscillator. Then the phase difference between the sound signals at points A and B is 90 degrees. Then the motional currents flowing across electrodes $C_A$ and $C_B$ due to the sound travelling in the delay line have a 90 degrees phase difference, resulting in zero DC output voltage of the mixer used as a phase detector (the $2f_0$ component is assumed to be filtered with the module "INT40" which can also be used to average the signal to improve signal-to-noise ratio if necessary). Any deviation $\Delta f$ from $\Delta f_0$ propagates directly into a non-zero DC-voltage of the mixer output which is then measured and acts as the frequency meter information.

It is important to note that Realization A is based on the standing wave operation, while Realization B is based on a propagating bulk wave. The advantage in standing wave operation is the ability to utilize the resonance for lowering the impedance level and reduce power consumption. On the other hand, the propagating wave structure is less susceptible to endpoint effects (e.g. contamination changing the acoustic length in standing wave operation).

In Realization C (FIG. 5) the frequency meter is based on an AC bridge that performs a phase-sensitive measurement of impedances of stable capacitors and stable resistors. The bridge is designed so that its output voltage is proportional to the frequency offset from its nominal value. A simple calculation illustrates the operation of the bridge. Let us assume that the two capacitors have both the value $C_A=C_B=C$ and the both resistors the value $R_A=R_B=R$. The angular frequency at which the bridge is at balance is determined by $$2\pi f_0 \, CR = 1 \qquad (1)$$

The frequency to be measured is $f=f_0+\Delta f$ and $\Delta f/f_0$ is small. It is straightforward to show that $$V_A - V_B \approx -jV_{in} - (\Delta f/f_0)V_{in} \qquad (2)$$

where terms of the order of $(\Delta f/f_0)^2$ or higher have been neglected, $V_{in}$ is the input signal and $j$ stands for the imaginary unit. By measuring the component of the voltage difference $V_A - V_B$ that is in the same phase as $V_{in}$ one can determine the deviation of the input frequency from $f_0$.

The long-term stability of the resonance frequency for the bulk acoustic wave resonators results basically from the fact that the characteristic frequency determining dimension (acoustic length L) is a large dimension for a micromechanical resonator, typically a quarter wavelength corresponds to several hundred micrometers for at 13 MHz. In comparison, for a typical beam-type flexural mode resonator, the fundamental resonance frequency is determined by the thickness, or by the width of the beam which is typically a few micrometers (two orders of magnitude less) at the same frequency. The large frequency determining dimension of BAW resonators is also beneficial in reducing the frequency offsets due to fabrication tolerances.

Another important application for the frequency tuning circuit is the compensation for the variations of parameters of the components that occur during manufacturing. The device-to-device variation concerns especially the absolute value of the resonance frequency. Calibration data of an individual reference oscillator can be stored to a memory circuit, which is part of the oscillator circuitry, and these data can be used to set the output frequency precisely at the desired value.

Figure 3:
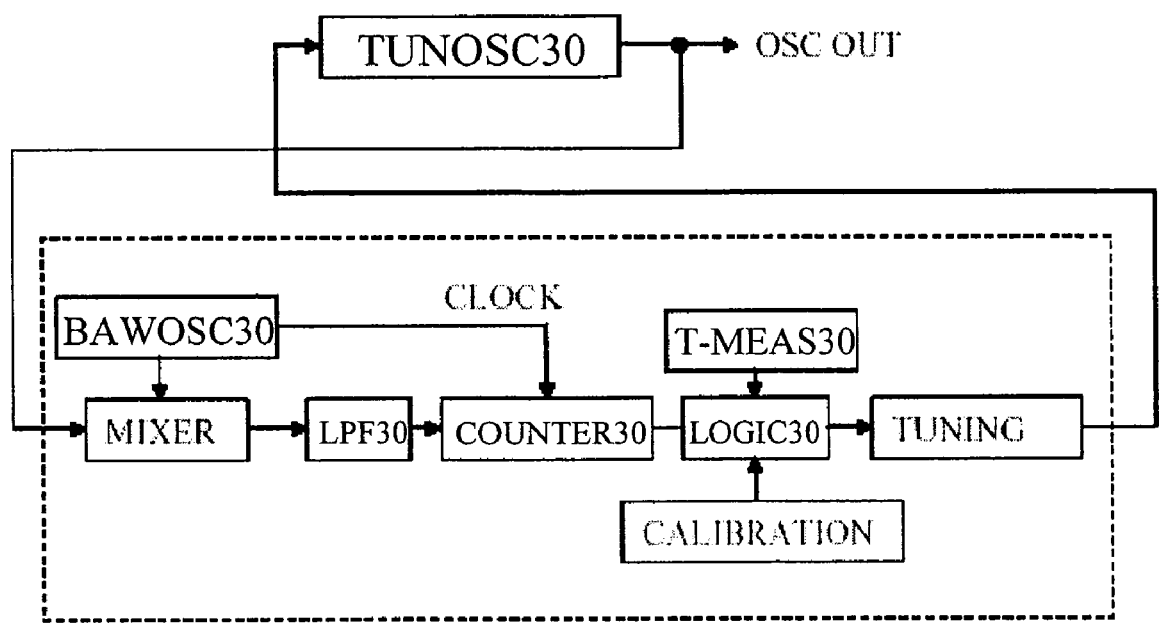
FIG. 3 is a block diagram of the reference oscillator according the scheme of FIG. 1 in which the frequency meter is based on an oscillator containing a micromachined silicon resonator operating in the bulk-acoustic mode.
Figure 4:
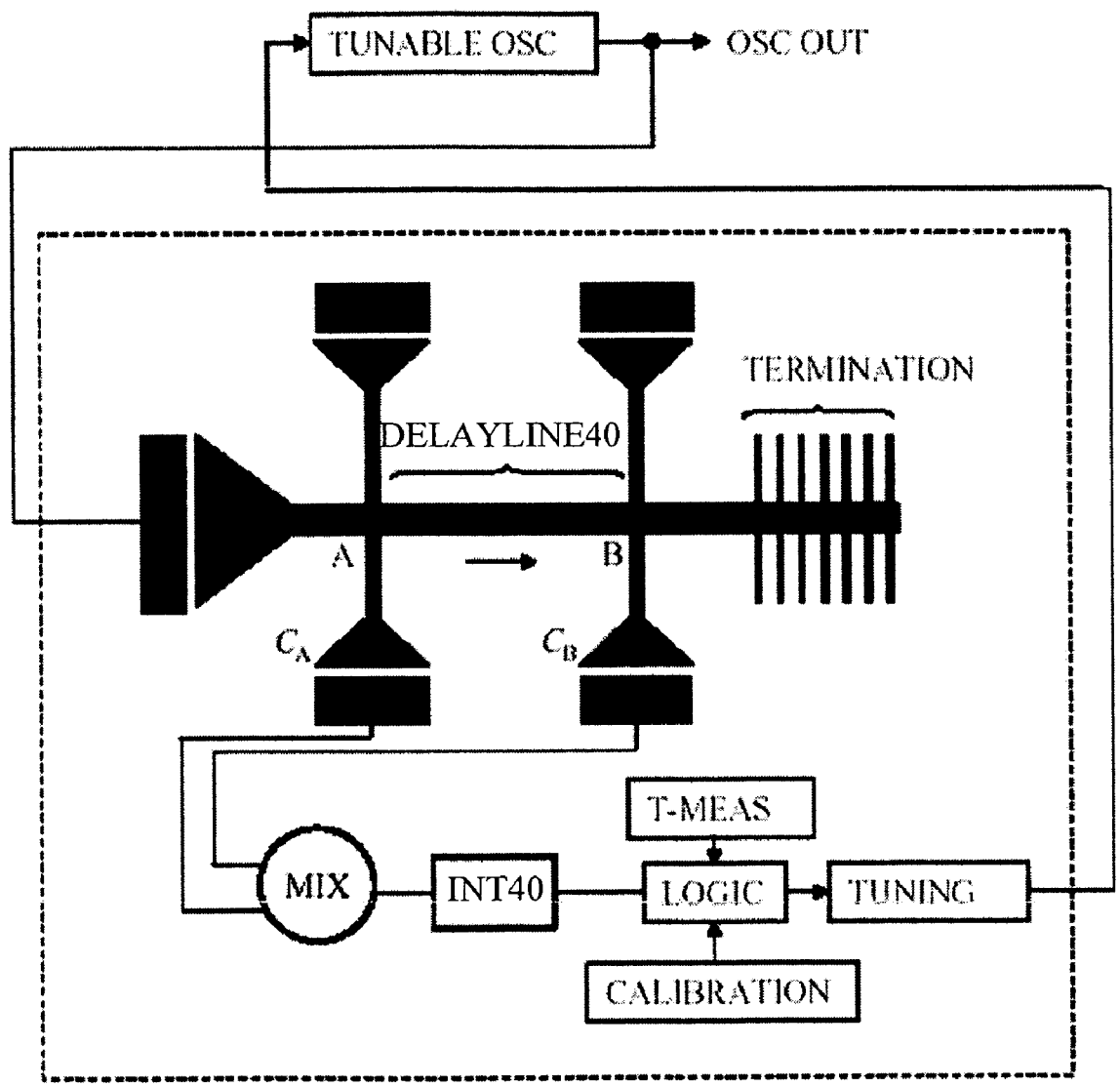
FIG. 4 is a block diagram of the reference oscillator according the scheme of FIG. 1 in which the frequency meter is based on a micromachined acoustical delay line.
Figure 5:
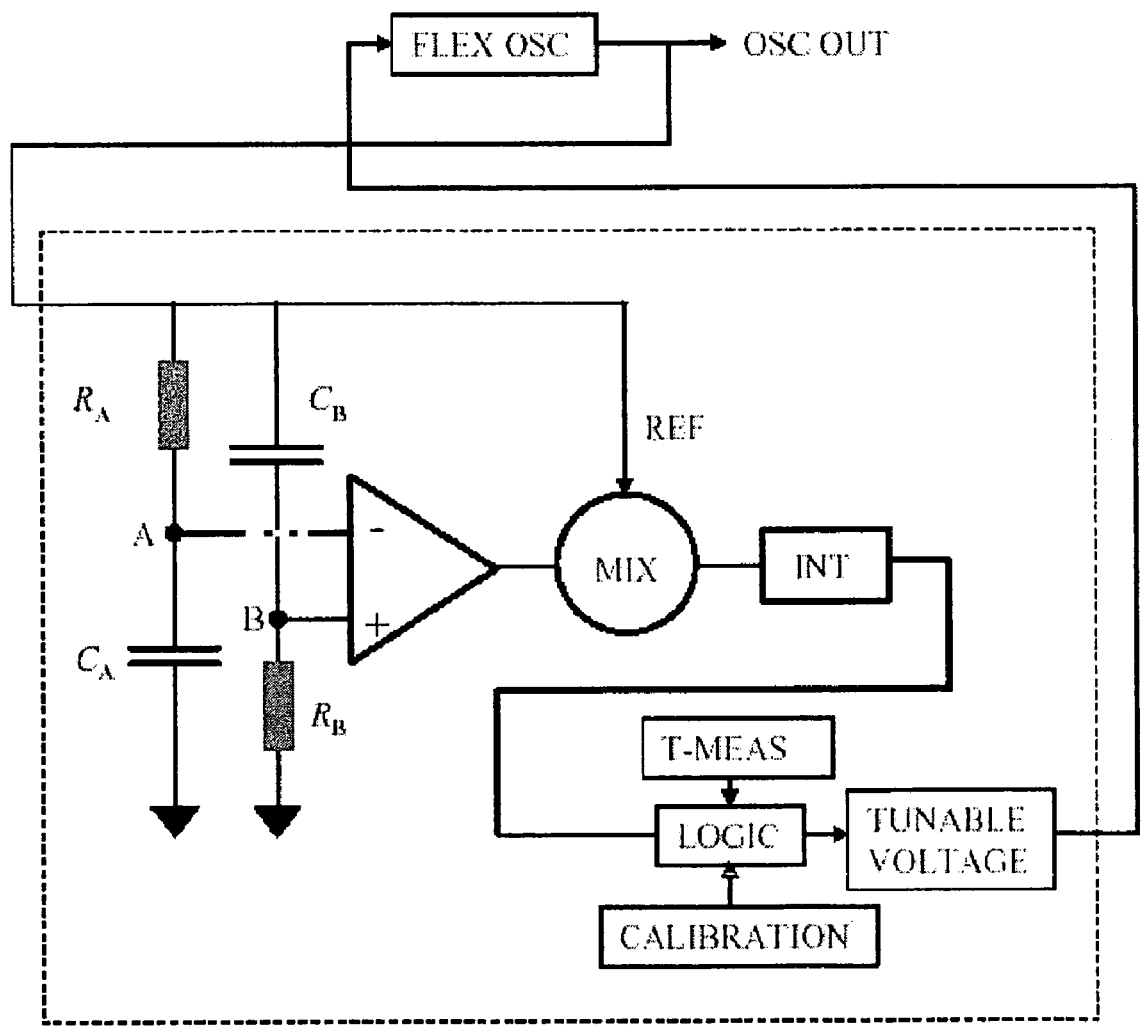
FIG. 5 is a block diagram of the reference oscillator according the scheme of FIG. 1 in which the frequency meter is based on a circuit formed from very stable resistors and capacitors.

The TUNABLE OSC in FIGS. 3-5 can have several different realizations based on micromachined resonators. Possible resonator geometries include the flexural mode resonators [e.g. cantilever, bridge, and the so-called double-ended tuning fork (DETF)] as well as bulk acoustic mode resonators. Both resonators and derived oscillators have extensively discussed in the recent literature. The benefits of flexural-mode resonators in TUNABLE OSC application include good short-term stability (i.e. low phase noise) and, in some cases, better tunability than BAW structures.

The frequency tuning can be accomplished, e.g., by a standard electrostatic tuning (adjusting the bias voltage) of the micromechanical resonator or using a component creating an adjustable reactance (e.g. varactor). There are flexural mode silicon resonators with resonance frequencies ranging from 3 to 45 MHz. The resonance frequencies could be shifted by 1% by applying a suitable bias voltage. This tuning range was significantly larger than the 0.15% change in the resonance frequency upon temperature variation from 25° C. to 85° C. If obtaining large enough tunability range poses a problem, a bank of two or more resonators TUNABLE OSC 1 . . . TUNABLE OSC n with slightly different mechanical resonance frequency can be used to narrow the required tunability range for a single resonator (FIG. 6).

Method 2

Figure 7:
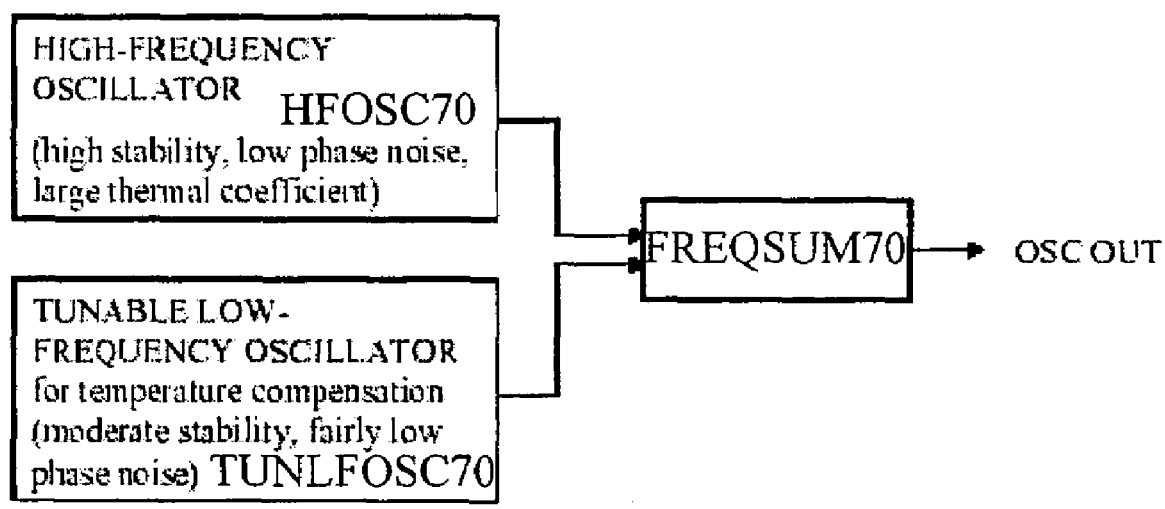
FIG. 7 is a block diagram of the reference oscillator which consist of two oscillators. One oscillator is a high-frequency oscillator $f_{high}$ with a small or nonexisting electrical frequency tuning capability $\Delta f_{high}$. The other oscillator is a low-frequency oscillator $f_{low}$ with a significantly larger electrical frequency tuning capability $\Delta f_{low} >> \Delta f_{high}$. The output frequency of the reference oscillator is synthesized by adding or subtracting the two frequencies $f_{high}$ and $f_{low}$.

In Method 2, illustrated in FIG. 7, the oscillator output frequency is synthesized from the frequencies of two oscillators HFOSC70 and TUNLFOSC70, both of which are based on micromachined resonators. The properties of the output signal are dominantly derived from the high-frequency oscillator that provides the long-term stability and the low phase noise. The properties of the high frequency oscillator may be realized using two or more micromachined components similarly as in Method 1. The crucial difference from Method 1 is that the output frequency of the high-frequency oscillator is left untuned, and the compensation for temperature and fabrication offsets is performed using frequency summing in FREQSUM70: to obtain constant and precise frequency output signal the frequency from a low-frequency tunable oscillator summed with the high-frequency oscillator output. The operation frequency of the low-frequency oscillator is chosen to allow tuning range required for the compensation required for the high frequency oscillator. For example, to compensate a 3000 ppm frequency offset for a 13 MHz oscillator, one needs at minimum a 39 kHz low-frequency oscillator. The critical advantages of Method 2 are: (i) since the high-frequency oscillator is left untuned, this gives additional degrees of freedom in design to obtain the required long-term stability and low phase noise, (ii) as only a small part of the signal long and short term stability is derived from the low-frequency oscillator, its long-term stability and phase noise requirements are less demanding, (iii) at low frequencies it is feasible to use designs that allow a large tuning range, e.g. flexural mode resonators. The frequency summing is achieved for example by multiplying the two oscillator signals using a mixer and successive filtering to select the sum or difference of the two frequencies. Critical for the performance is typically the filtering of the other of the two frequency components in the mixer output. A standard image-reject mixer technique can be used in selecting one of the two frequencies. In necessary, a further narrow-band filter can be created using micromachined resonator structure as shown in FIG. 8.

In Method 2 (FIG. 7) the high-frequency oscillator can be realized using one or more micromachined resonators. Good long-term stability and low phase noise can be obtained from a single bulk acoustic wave resonator as tunability is not needed in this case, but for even better performance the long-term stability and low phase noise can be derived from two or more components as in Method 1. The temperature and fabrication tolerance compensation in Method 2 (FIG. 7) is performed using a tunable low-frequency oscillator, whose output is frequency-summed with the high-frequency oscillator. As the required tunability range is typically less than 1% (required T-compensation typically 0.3%), the resonance frequency of the low-frequency oscillator can be typically two orders of magnitude smaller than for the high-frequency oscillator. For example, in the case of $f_{HIGH}=13$ MHz high-frequency oscillator, the low-frequency oscillator operates at $f_{LOW}$~a few hundred kHz and is best realized using a flexural-type resonator. The long- and short-term stability of the output signal is originates dominantly from the high-frequency oscillator: the low frequency oscillator contributes only by a factor $f_{LOW}/f_{HIGH}$. Therefore, the reduced long-term stability of a flexural-mode resonator is sufficient for maintaining the required high stability of the oscillator output signal.

Figure 8:
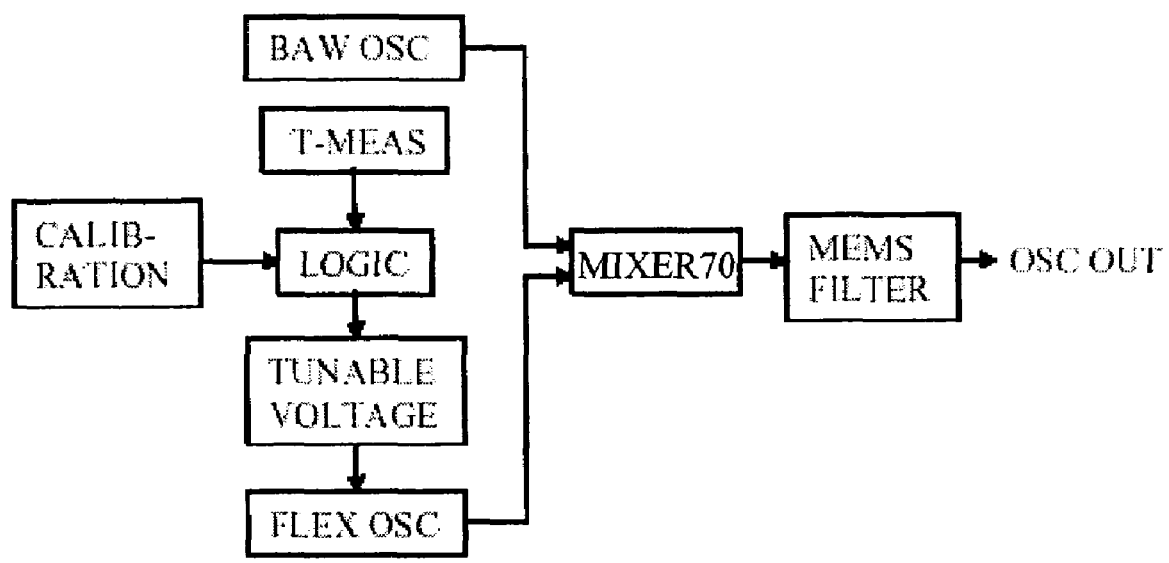
FIG. 8 is a block diagram of the reference oscillator which consist of a stable oscillator based on a micromechanical resonator, a low-frequency voltage-controlled oscillator, an image-reject mixer, and a filter based on a micromechanical resonator.

FIG. 8 shows a possible realization for frequency summing in Method 2. The output frequency of the reference oscillator is $f_{OUT}=f_{BAW}-f_{FLEX}$. The mixer MIXER80 is an image-reject mixer which rejects the image frequency $f_{BAW}+f_{FLEX}$. Alternatively, the image-reject mixer can be designed to reject $f_{BAW}-f_{FLEX}$. so that the output frequency of the reference oscillator is $f_{OUT}=f_{BAW}+f_{FLEX}$.

Further improvement in the image-frequency rejection can be obtained by filtering the reference oscillator output signal by using a filter based on a resonator with a center frequency near the reference oscillator frequency $f_{ref}$. The filter is designed so that its mechanical quality factor is only moderate so that the variation in its center frequency, $\Delta f_0$, including possible drifts during the designed life time of filter, is smaller than $f_0/Q$. The filter can be realized as a high-order filter comprising of several micromechanical resonators to further improve the frequency selectivity. All the micromachined components required in Method 1 and 2 can be manufactured e.g. using a process based on deep reactive ion etching (DRIE) of silicon-on-insulator (SOI) wafers. Another fabrication process that could be employed to fabricate bulk-acoustical mode resonators is the described in U.S. Pat. No. 5,719,073 (U.S. patent application Ser. No. 08/312,797), entitled "Microstructures and Single Mask, Single-Crystal Process for Fabrication Thereof," of Shaw et al, filed Sep. 27, 1994. Functionally similar components can be also manufactured by several other processes that are based on using either single-crystal silicon or polycrystalline silicon.

Figure 9:
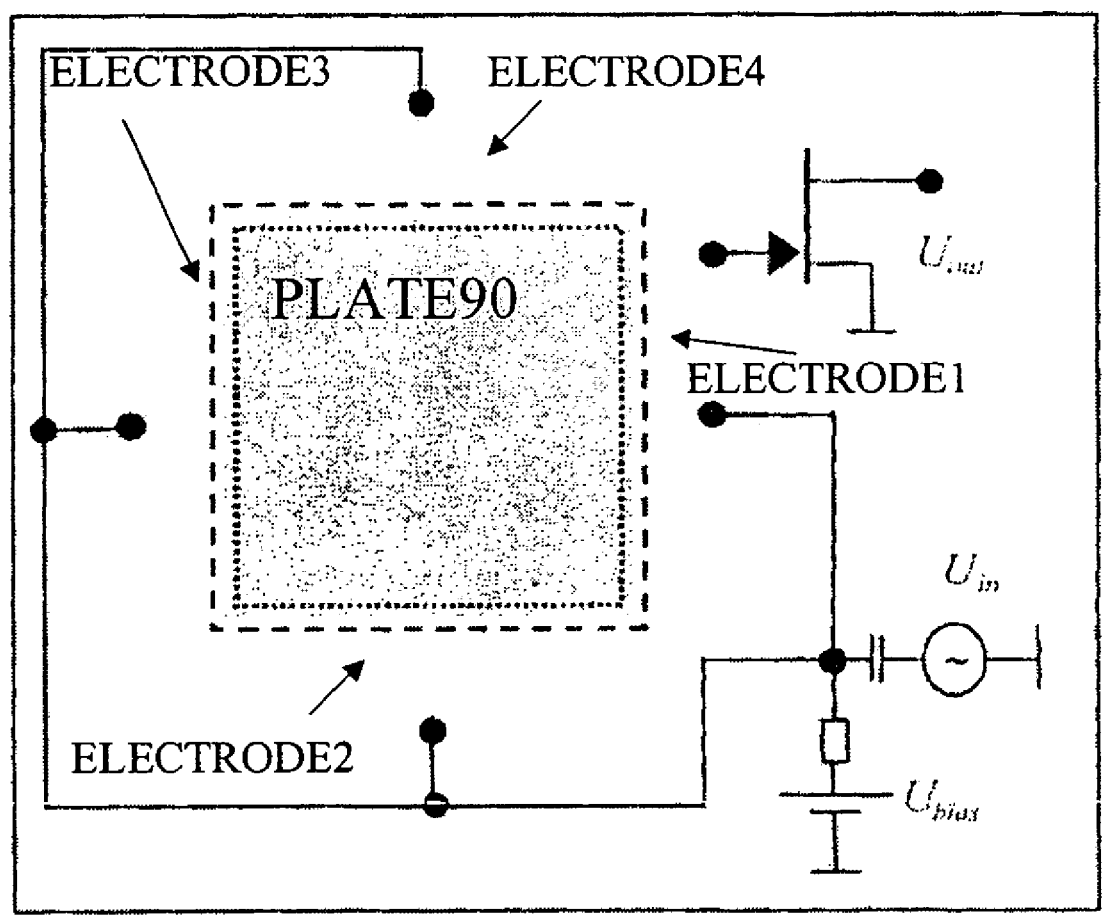
FIG. 9 is a schematic view of a square-extensional MEMS resonator showing the vibration mode and biasing and driving set-up.

An advantageous MEMS component for reference oscillator according to the present invention is depicted in FIG. 9. FIG. 9 presents a micromechanical 13.1 MHz bulk acoustic mode (BAW) silicon resonator, comprising a square plate PLATE90, electrodes ELECTRODE1-ELECTRODE4 for capacitive coupling on all sides of the plate, voltage sources $U_{in}$ and $U_{bias}$ connected to the electrodes and output voltage $U_{out}$. The vibration mode is characterised as a 2-D plate expansion that preserves the original square shape. The component can be made by deep reactive ion etching of silicon-on-insulator (SOI) wafer. The electrical contact to the resonator is done with corner anchoring (T-type corner anchoring) so that the entire device can be fabricated with one mask. FIG. 9 shows the vibration mode and biasing and driving set-up. Dashed and dotted lines indicate expanded and contracted shapes.

It is obvious to the person skilled in the art that different embodiments of the invention are not limited to the example described above, but that they may be varied within the scope of the enclosed claims.

The invention claimed is:

1. MEMS (Micro Electro Mechanical Systems) reference oscillator with stabilized frequency, characterised in that the oscillator comprises:
    two or more MEMS components, wherein each MEMS component is characterized by a set of properties, and
    a combiner for selective combination of the desired properties from the MEMS components,
characterised in that at least one of the components is a micromechanical bulk acoustic mode silicon resonator with a square plate and electrodes for capacitive coupling arranged on all sides of the plate, wherein the vibration mode is characterised as a 2-D plate expansion that preserves the original square shape.

2. MEMS reference oscillator according to claim 1, characterised in that the type of at least one MEMS component is different from the types of the other MEMS components.

3. MEMS reference oscillator according to claim 1, characterised in that the components are identical but their control parameters, including bias voltage, are different.

4. MEMS reference oscillator according to claim 1, characterised in that the oscillator utilizes a stable frequency reference based on an bulk acoustic mode oscillator and a frequency meter operation based on comparing the frequency created by the bulk acoustic wave oscillator with the output frequency of the oscillator.

5. MEMS (Micro Electro Mechanical Systems) reference oscillator with stabilized frequency, characterised in that the oscillator comprises:
    two or more MEMS components, wherein each MEMS component is characterized by a set of properties, and
    a combiner for selective combination of the desired properties from the MEMS components,
characterised in that the oscillator utilizes a stable frequency reference obtained by measuring the phase difference of propagating bulk acoustical wave in a micromachined sound-wave guide at fixed positions.

6. MEMS (Micro Electro Mechanical Systems) reference oscillator with stabilized frequency, characterised in that the oscillator comprises:
    two or more MEMS components, wherein each MEMS component is characterized by a set of properties, and
    a combiner for selective combination of the desired properties from the MEMS components,
    characterised in that the oscillator utilizes a frequency meter based on stable capacitors and stable micromachined thin-film resistors that are used to create the Wien oscillator topology.

7. MEMS (Micro Electra Mechanical Systems) reference oscillator with stabilized frequency, characterised in that the oscillator comprises:
    two or more MEMS components, wherein each MEMS component is characterized by a set of properties, and
    a combiner for selective combination of the desired properties from the MEMS components,
    characterised in that a capacitor-resistor network, that is part of the Wien oscillator circuit, is used as a frequency meter in which the capacitors and resistors form a bridge circuit the balance of which depends on the frequency of the incoming frequency.

* * * * *